(12) United States Patent
Isham

(10) Patent No.: US 6,975,261 B1
(45) Date of Patent: Dec. 13, 2005

(54) HIGH ACCURACY DIGITAL TO ANALOG CONVERTER USING PARALLEL P AND N TYPE RESISTOR LADDERS

(75) Inventor: Robert H. Isham, Flemington, NJ (US)

(73) Assignee: Intersil America's Inc., Milpitas, CA (US)

( * ) Notice: Subject to any disclaimer, the term of this patent is extended or adjusted under 35 U.S.C. 154(b) by 0 days.

(21) Appl. No.: 10/988,912

(22) Filed: Nov. 15, 2004

Related U.S. Application Data

(60) Provisional application No. 60/591,951, filed on Jul. 28, 2004.

(51) Int. Cl.[7] ............................................. H03M 1/66
(52) U.S. Cl. ................................... 341/144; 341/154
(58) Field of Search .............................. 341/154, 144; 330/307; 257/537, 538

(56) References Cited

U.S. PATENT DOCUMENTS 5,589,702 A * 12/1996 Alter .......................... 257/379
5,614,864 A * 3/1997 Stubbe et al. ................. 330/69
6,018,272 A * 1/2000 Marsh et al. ................ 330/307

* cited by examiner

*Primary Examiner*—Peguy JeanPierre
(74) *Attorney, Agent, or Firm*—Gary R. Stanford

(57) ABSTRACT

A D/A converter including first and second R-R2 resistor ladders and a set of SPDT switches. The first R-2R resistor ladder includes N type resistors coupled between a common voltage node and an output voltage node and the second R-2R resistor ladder includes P type resistors coupled between the common and output voltage nodes. The R-2R resistor ladders have multiple common switch terminals, each coupling an N type 2R resistor to a corresponding P type 2R resistor. Each SPDT switch is responsive to a data bit for switching a common switch terminal between the common voltage and a reference voltage. Each N type resistor may be formed in a PWell coupled to the common (or more negative) voltage and each P type resistor may be formed in an NWell coupled to the reference (or more positive) voltage. The SPDT switches may be configured with equivalent switch path impedances.

18 Claims, 2 Drawing Sheets

D/A CONVERTER WITH PARALLEL P AND N TYPE R-2R RESISTOR LADDER

*D/A CONVERTER WITH CONVENTIONAL R-2R RESISTOR LADDER*

*D/A CONVERTER WITH PARALLEL P AND N TYPE R-2R RESISTOR LADDER*

ABSTRACT

HIGH ACCURACY DIGITAL TO ANALOG CONVERTER USING PARALLEL P AND N TYPE RESISTOR LADDERS

CROSS-REFERENCE TO RELATED APPLICATIONS

This application claims the benefit of U.S. Provisional Application Ser. No. 60/591,951, filed on Jul. 28, 2004, which is herein incorporated by reference for all intents and purposes.

BACKGROUND OF THE INVENTION

1. Field of the Invention

The present invention relates to digital to analog (D/A) converters, and more particularly to a high accuracy D/A converter using parallel P and N type resistor ladders.

2. Description of the Related Art

D/A converters using R-2R or segmented R (resistor/resistive) strings or ladders are relatively common. The resistor string or ladder is coupled to a common node (e.g., ground), a reference voltage, and an output node, and is typically segmented or the like forming multiple switch nodes. A series of switches, such as single-pole, double throw (SPDT) switches or the like, are each coupled to a corresponding switch node and responsive to a corresponding one of multiple data bits of an input digital value. Each "bit" switch couples its corresponding switch node between two different voltages or voltage nodes, such as between ground and the reference voltage, based on the corresponding data bit. The collective state of the data bits dictate the voltage level of the output node thereby representing the input digital value.

The accuracy of the D/A converter is directly affected by the matching of the resistors and also by the resistive matching of the two halves of each SPDT switch. Concerning resistor matching, diffused resistors have a strong voltage coefficient; the resistance of a diffused resistor increases as the voltage is increased between the resistor and the substrate "Well" in which it is contained. Thus, a simple diffused resistor was usually not considered sufficiently accurate to achieve an accurate D/A converter. High value poly or deposited metal resistors are available in some processes, but add significant extra cost. High value poly or deposited metal resistors are not available in many common processes. Concerning switch matching, the relative switch impedances between the two switching paths should match as closely as possible. A possible alternative solution is to make the switches have negligible resistance compared to the resistors of the ladder, such as by using very large switching devices. Such alternative configuration is undesirable due to layout area and potential parasitic capacitance.

The present disclosure addresses both resistance matching accuracy and switch matching accuracy.

SUMMARY OF THE INVENTION

A D/A converter according to an embodiment of the present invention includes a first string of N type diffused resistors, a second string of P type diffused resistors, and multiple bit switches. The first and second strings are each divided into segments and coupled together at corresponding switch nodes and collectively form an output node. Each bit switch is responsive to a corresponding data bit of an input digital value for switching a corresponding switch node between common and reference voltages.

Each of the N type diffused resistors may be formed in a PWell which is coupled to the common voltage. Also, each of the P type diffused resistors may be formed in an NWell which is coupled to the reference voltage. The ratio of values of the P type and N type diffused resistors may be adjusted to achieve a net zero voltage coefficient between the first and second strings. In one embodiment, each of the first and second strings may be configured as an R-2R ladder in which each 2R resistor is coupled to a corresponding switch node. In this case, each bit switch selectively switches an N type 2R resistor of the first string and a corresponding P type 2R resistor of the second string between the common and reference voltages.

Each bit switch may be configured with equal switch path impedances. In one embodiment, each bit switch includes a driver, an inverted driver and a pair of NMOS devices. The driver has an output that is driven between the common voltage and a source voltage and an input that receives a corresponding data bit. The inverter driver has an output that is driven between the common voltage and a difference voltage and an input that receives the corresponding data bit. The difference voltage is a voltage difference between the source voltage and the reference voltage. The first NMOS device has a drain coupled to the reference voltage, a gate coupled to the output of the driver and a source coupled to a corresponding switch node. The second NMOS device has a drain coupled to the corresponding switch node, a gate coupled to the output of the inverter driver and a source coupled to the common voltage. The first NMOS device may have a floating PWell coupled to its source and the second NMOS device may have a PWell coupled to its source, which corresponds to common.

A voltage generator may be used to provide the difference voltage. In one embodiment, the voltage generator includes first and second resistors, a current source, a PNP transistor and an NPN transistor. The first resistor has a first end coupled to the source voltage and a second end developing the difference voltage. The second resistor has a first end coupled to the common voltage and a second end. The current source has an input coupled to the source voltage and an output. The PNP transistor has an emitter coupled to the output of the current source, a base coupled to the reference voltage, and a collector coupled to the common voltage. The NPN transistor has a collector coupled to the second end of the first resistor, a base coupled to the emitter of the PNP transistor, and an emitter coupled to the second end of the second resistor.

A digital to analog converter according to another embodiment of the present invention includes first and second R-R2 resistor ladders and a set of single-pole, double-throw (SPDT) switches. The first R-2R resistor ladder includes N type resistors coupled between a common voltage node and an output voltage node and the second R-2R resistor ladder includes P type resistors coupled between the common and output voltage nodes. The first and second R-2R resistor ladders have multiple common switch terminals, each coupling one end of an N type 2R resistor of the first R-2R resistor ladder to one end of a corresponding P type 2R resistor of the second R-2R resistor ladder. Each SPDT switch is responsive to a corresponding data bit for switching a corresponding common switch terminal between the common voltage node and a reference voltage node.

Each N type resistor may be formed in a PWell coupled to the common voltage node or a more negative (−) node and each P type resistor may be formed in an NWell coupled to the reference voltage node or a more negative node. The ratio of values of the P type and N type resistors may be adjusted to achieve a net zero voltage coefficient between the first and second R-2R resistor ladders. The SPDT switches may be configured as previously described, and may employ the voltage generator previously described, to achieve equivalent switch path impedances.

A method of converting multiple data bits to an analog value according to an embodiment of the present invention includes forming a pair of P and N type diffused resistor strings coupled in parallel between a common node and an output node and with multiple intermediate nodes, and forming multiple switches, each responsive to a corresponding data bit to switch a corresponding intermediate node between the common node and a reference voltage node. The method may include forming each N type diffused resistor in a PWell coupled to the common node and forming each P type diffused resistor in an NWell coupled to the reference voltage node. The method may include adjusting a ratio of values of the P and N type diffused resistor strings to achieve a net zero voltage coefficient.

The method may include forming multiple drivers, multiple inverting drivers, multiple first NMOS devices and multiple second NMOS devices. Each multiple driver is responsive to a corresponding data bit for switching its output between a voltage level of the common node and a source voltage level. Each inverting drivers is responsive to a corresponding data bit for switching its output between a voltage level of the common node and a difference voltage being a difference between the source voltage level and a voltage of the reference voltage node. Each first NMOS device has a gate coupled to the output of a corresponding driver, a drain coupled to the reference voltage node, and a floating PWell and source coupled to a corresponding intermediate node. Each second NMOS device has a gate coupled to the output of a corresponding inverting driver, a drain coupled to the corresponding intermediate node, and a floating PWell and source coupled to the common node.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
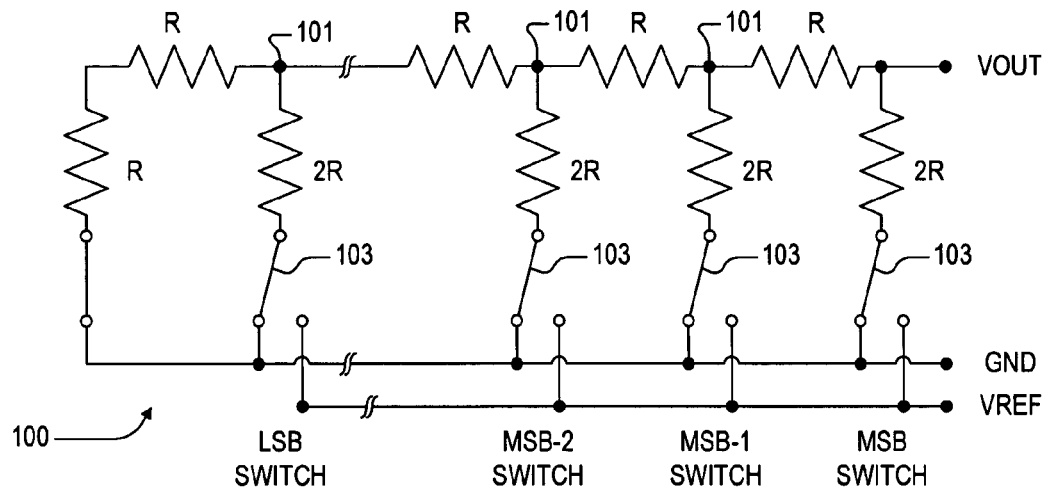
FIG. 1 is a schematic diagram of a D/A converter implemented with a conventional R-2R resistor ladder.

FIG. 1 is a schematic diagram of a D/A converter 100 implemented with a conventional R-2R resistor ladder. Each resistor is labeled "R" or "2R" in which R is a selected resistance value depending upon the process and/or application. As known to those skilled in the art, the R resistors are coupled in series between a common node, such as ground (GND), and a source or output voltage node, such as VOUT, forming multiple intermediate nodes or junctions 101. The 2R resistors each have one end coupled to a selected junction 101 between two of the series-coupled R resistors and another end coupled to a common pole of a corresponding one of a series of single-pole, double throw (SPDT) switches 103. The common pole of each SPDT switch 103 is switched between GND and a reference voltage node VREF depending upon a corresponding data bit signal controlling the "bit" switch. The input data bits range from the most significant bit (MSB) on the right to the least significant bit (LSB) on the left. The switches 103 are organized from a MSB switch 103 responsive to the MSB of the digital value and coupled to one end of a 2R resistor having its other end coupled to VOUT, to a LSB switch 103 responsive to the LSB of the digital value and coupled to one end of a 2R resistor having its other end coupled to the next to last intermediate junction 101 of the string of R resistors closest to GND (e.g., the common node). In this manner, the MSB switch 103 makes an output change at VOUT of ½ of a reference voltage VREF, the next switch (MSB-1) 103 makes an output change at VOUT of ¼ of VREF, the next switch (MSB-2) 103 makes an output change at VOUT of ⅛ of VREF, and so on down to the LSB switch 103 making the smallest change depending upon the total number of segments of the resistor ladder.

The accuracy of the D/A converter 100 is directly affected by the matching of the resistors and also by the matching of the two halves of each SPDT switch 103. Concerning resistor matching, diffused resistors have a strong voltage coefficient; the resistance of a diffused resistor increases as the voltage is increased between the resistor and the substrate "Well" in which it is contained. Thus, diffused resistors are usually not considered sufficiently accurate to achieve an accurate R-2R D/A converter. High value poly or deposited metal resistors are available in some processes, but add significant extra cost. High value poly or deposited metal resistors are not available in many common processes. Concerning switch matching, the switch impedance from any 2R resistor to the VREF node should match the switch impedance of that same 2R resistor to the common node (e.g., GND). As understood by those of ordinary skill in the art, each switch 103 performs the SPDT function in which it switches the common pole to a selected one of the output poles responsive to the state of the corresponding data bit. A possible alternative solution to matching switch impedances is to make the switches 103 have negligible resistance compared to each resistor 2R, such as by using very large switching devices. Such alternative configuration is undesirable due to layout area and potential parasitic capacitance.

Figure 2:
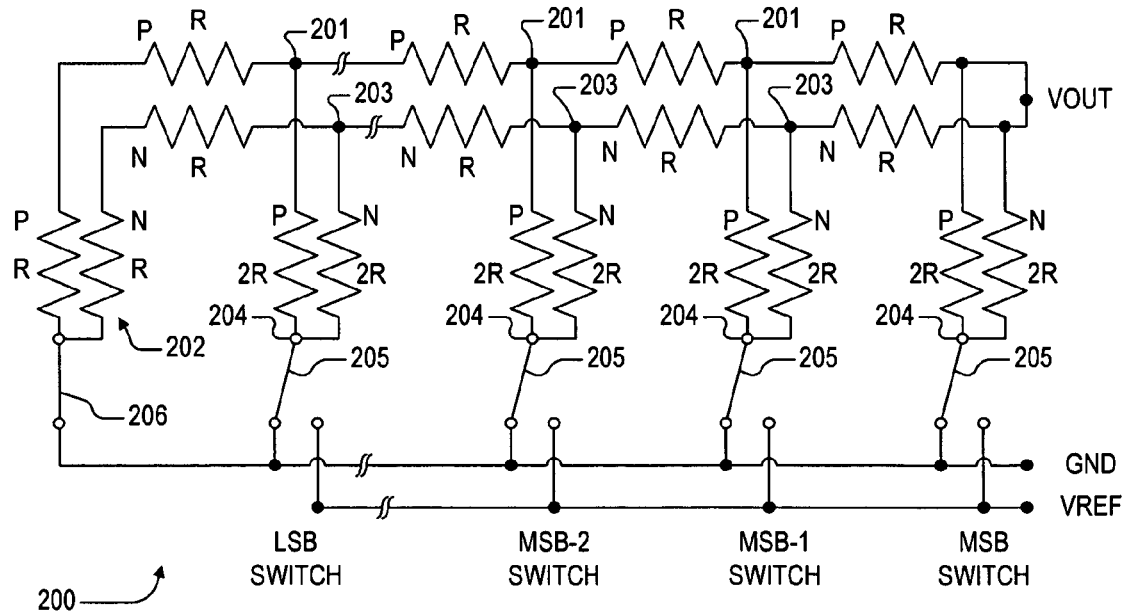
FIG. 2 is a schematic diagram of a D/A converter implemented with an exemplary parallel configuration of P and N type R-2R resistor ladders according to an embodiment of the present invention.

FIG. 2 is a schematic diagram of a D/A converter 200 implemented with an exemplary parallel configuration of P type and N type R-2R resistor ladders according to an embodiment of the present invention. Although the present invention is illustrated using R-2R resistor ladders, the present invention is equally applicable to other configurations of segmented resistive strings or ladders or other resistive networks. The D/A converter 200 is organized in a similar manner as the D/A converter 100 with the bits ranging from the MSB on the right to the LSB on the left. The D/A converter 200 includes two separate R-2R resistor strings formed in parallel between GND and VOUT, one string including P type diffused resistors and the other string including N type diffused resistors. The P type ladder includes a string of P type resistors R coupled in series between GND and VOUT forming a first set of intermediate junctions 201 and the N type ladder includes a string of N type resistors R coupled in series between GND and VOUT forming a second set of intermediate junctions 203. The first P and N type resistors of each string, shown at 202, which are both "coupled" or otherwise referenced to GND, are shown coupled to one pole of a single-pole, single-throw (SPST) switch 206 shown in the closed position.

Each 2R resistor of the D/A converter 100 is replaced with a P type 2R resistor and an N type 2R resistor. The P type 2R resistor has one end coupled to a corresponding one of the intermediate junctions 201 and the N type 2R resistor has one end coupled to a corresponding one of the intermediate junctions 203. The other ends of pair of P and N type 2R resistors are coupled together at a corresponding one of a series of intermediate switch terminals or nodes 204. The intermediate switch nodes 204 form a set of common switch terminals between the P and N type resistor ladders. The switches 103 of the D/A converter 100 are replaced with another set of SPDT switches 205, each having a common pole coupled to a corresponding one of the switch nodes 204. The output or switched terminals of each of the switches 205 are coupled to the GND and VREF nodes, respectively, similar to the switches 103. In this manner, for the D/A converter 200, the MSB switch 205 makes an output change at VOUT of ½ of a reference voltage VREF, the next switch (MSB-1) 205 makes an output change at VOUT of ¼ of VREF, the next switch (MSB-2) 205 makes an output change at VOUT of ⅛ of VREF, and so on down to the LSB switch 205 making the smallest change which depends upon the number of segments of the resistor ladder of the D/A converter 200.

The switch 206 remains in the closed position and is not opened during normal operation, and may in fact be fixed or hardwired into the closed position. Although the first P and N type resistors 202 could each be directly hardwired to GND (such as by removing the switch 206), the switch 206 inserts a resistance to balance with the other switches 205. In one embodiment, the switch 206 is configured substantially similar to or identical with the switches 205 except permanently switched to the common node or GND position. Alternatively, the switch 206 may be a simplified version of the switches 205 with the same switch resistance, as further described below.

Figure 2A:
FIG. 2A is a more detailed schematic diagram illustrating further detail of each of the diffused resistors of the D/A converter of FIG. 2.

FIG. 2A is a more detailed schematic diagram illustrating further detail of each of the diffused resistors of the D/A converter 200. Many processes intended for analog use and the like include two polarities of resistors including the P type diffused resistor contained in an NWell, and the N type diffused resistor contained in a PWell. For proper operation, the P type resistor is biased at a lower voltage than its NWell, and the N type resistor is biased at a higher voltage than its PWell. As shown at 210, the NWell of each of the P type resistors is coupled to VREF, as illustrated by a diode connection with its anode coupled to the P type resistor and its cathode coupled to VREF. A "P" denotes the P type resistor and an "XR" denotes a relative resistance value with a multiple X factor of a selected resistance value R, such as R (X=1) for each R resistor or 2R (X=2) for each 2R resistor. In a similar manner as shown at 212, the PWell of each of the N type resistors is coupled to GND, as illustrated by a diode connection with its cathode coupled to the N type resistor and its anode coupled to GND. An "N" denotes the N type resistor and the XR denotes the resistance value.

Since the P type and N type resistor ladders are coupled in parallel, the voltage coefficients of the P and N type resistors tend to cancel out. In particular, as the parallel combination of resistors moves in voltage, the resistance values of the P type resistors move in the opposite direction as the resistance values of the N type resistors, producing little net change. In addition, if the voltage coefficient (indicative of the relative resistance change per unit voltage change) of the P type resistors is different from the voltage coefficient of the N type resistors, the ratio of the resistance values of the P type and N type resistors may be adjusted to get a net zero (or very small) voltage coefficient for the parallel combination. For example, the "X" factor for each resistor of one ladder or the other (or both) is adjusted to achieve a net zero voltage coefficient for the parallel combination.

If VREF is relatively close to GND instead of near a voltage supply level, such as VCC, then both the 2R to GND and 2R to VREF portions of the switches 205 are configured as N-type metal-oxide semiconductor (NMOS) devices. A problem arises in that the NMOS device between 2R and GND has a higher gate drive (e.g., such as VCC) than the NMOS device between 2R and VREF for each switch 205. One possible solution is to make the NMOS device between 2R and VREF larger. This solution is not optimal, since although it may work at a given voltage and temperature, it does not track changes in either voltage or temperature.

Figure 3:
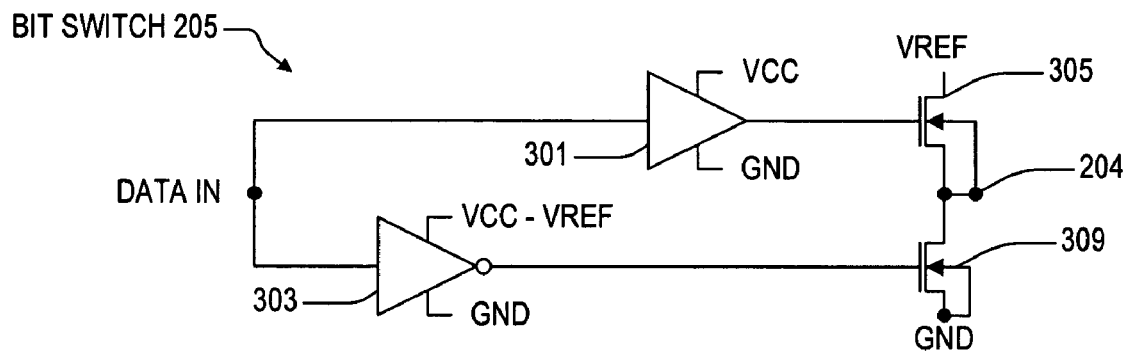
FIG. 3 is a schematic diagram of an exemplary embodiment of each of the bit switches of the D/A converter of FIG. 2.

FIG. 3 is a schematic diagram of an exemplary embodiment of each of the SPDT bit switches 205 of the D/A converter 200 configured as switch drivers. A data input signal DATA IN is provided to the inputs of a driver 301 and to an inverter driver 303. The driver 301 is biased or powered between VCC and GND so that it switches, depending upon the DATA IN signal, between VCC and GND at its output, which is coupled to the gate of an NMOS device 305. The drain of the NMOS device 305 is coupled to VREF and its source and floating PWell is coupled to a corresponding one of the intermediate nodes 204, which is further coupled to one terminal each of a corresponding pair of P type and N type 2R resistors of the D/A converter 200. The driver inverter 303 is biased or powered between a difference voltage VCC–VREF and GND and thus switches, depending upon the DATA IN signal, between VCC–VREF and GND at its output, which is coupled to the gate of another NMOS device 309. The drain of the NMOS device 309 is coupled to the corresponding node 204 and its source and floating PWell are coupled to GND. In one embodiment, the driver 301 is implemented using a pair of CMOS inverters biased between VCC and GND to provide a non-inverting output, and the driver inverter 303 is implemented with a CMOS inverter biased by the difference voltage VCC–VREF.

In operation of the switch 205 configured as shown in FIG. 3, when DATA IN is asserted high or a logic one, the driver inverter 303 drives its output low to GND turning off the NMOS device 309. Also, while DATA IN is high, the driver 301 drives the gate of the NMOS device 305 high to VCC to effectively couple the corresponding node 204 to VREF through the switching impedance of the NMOS device 305. When DATA IN is asserted low or a logic zero, the driver 301 drives its output low to GND turning off the NMOS device 305. Also, while DATA IN is low, the driver 303 drives the gate of the NMOS device 305 to the difference voltage VCC−VREF to effectively couple the corresponding node 204 to GND through the switching impedance of the NMOS device 309.

Since the NMOS devices 305 and 309 have the same threshold and gate bias when turned on (due to the relative value of the output voltages of the drivers 301 and 303), they have matched impedances. In particular, the switch impedance of the NMOS device 309 (driven by VCC) is balanced with the switch impedance of the NMOS device 305 (driven by VCC−VREF). The difference voltage VCC−VREF is used to bias each of the NMOS devices (e.g., 309) coupled between GND and the 2R terminals (e.g., a node 204) of each switch 205. The full VCC supply is used to bias each of the NMOS devices (e.g., 305) coupled between VREF and the 2R terminals (e.g., node 204) of each switch 205. A process that has floating PWells for the NMOS devices 305 and 309 is used for best results, where each VREF to 2R NMOS device 305 has its PWell tied to its source terminal and each GND to 2R NMOS device 305 has its PWell tied to GND. As a result, all of the NMOS devices 305 and 309 have the same threshold and gate terminal bias, so they have matched impedances.

The switch 206 may be configured in a similar manner as that shown in FIG. 3, except that the DATA IN node is permanently coupled to the common node GND and the corresponding node 204 is coupled to the common terminal of the first P and N type resistors 202 of the resistor ladders. For the switch 206, the input of the inverter driver 303 is always low so that it asserts its output high to VCC−VREF to turn on the NMOS device 309. The driver 301, if present, pulls its output low to GND turning off the NMOS device 305, if present. Alternatively, for the switch 206, the driver 301 and the NMOS device 305 may be eliminated as unnecessary.

Figure 4:
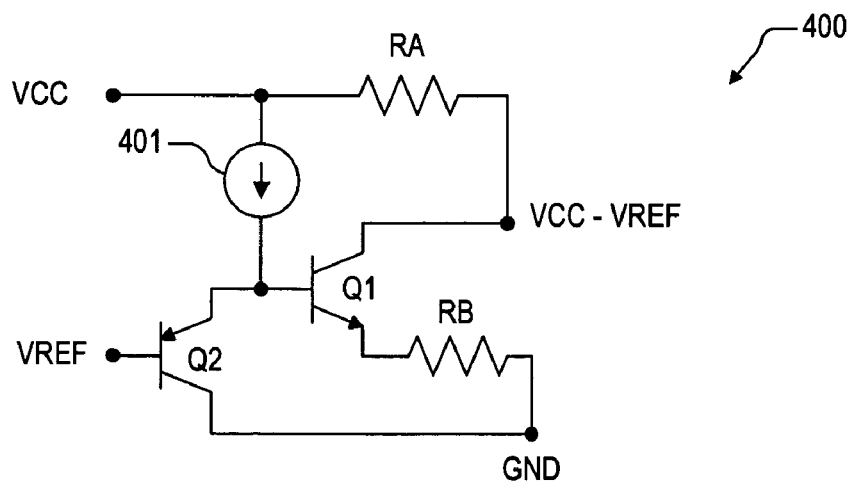
FIG. 4 is a schematic diagram of an exemplary voltage generator that provides a difference voltage used to bias the driver inverter of FIG. 3.

FIG. 4 is a schematic diagram of an exemplary voltage generator 400 that provides the difference voltage VCC−VREF used to bias the driver inverter 303 for each of the switches 205 (and the switch 206). VCC is coupled to one end of a first resistor RA and to an input of a current source 401. The output of the current source 401 is coupled to the base of an NPN bipolar junction transistor (BJT) Q1 and to the emitter of a PNP BJT Q2. The base of Q2 receives VREF and its collector is coupled to GND. The collector of Q1 is coupled to the other end of the resistor RA and develops the difference voltage VCC−VREF. The emitter of Q1 is coupled to one end of another resistor RB, having its other end coupled to GND. The resistors RA and RB have equal resistances (e.g., RA=RB).

In operation of the voltage generator 400, VREF biases Q2 to control Q1 to develop a current through the resistor RB, which causes an approximately equal current to pass through the resistor RA tied to VCC. In this manner, the voltage at the collector of Q1 is VCC−VREF used for biasing the driver inverter 303 of each of the bit switches 205 of the D/A converter 200.

A parallel configuration of P type and N type R-2R resistor ladders according to an embodiment of the present invention is relatively accurate, resulting in a D/A converter with substantially less than (<<) 0.1% error. The resistor ladders are implemented with diffused resistors, which were previously considered inappropriate for implementing highly accurate D/A converters because of their large voltage coefficients. Instead, the P side counterbalances the N side. And further, the bit switches are configured with equivalent switch path impedances to further improve accuracy.

Although the present invention has been described in considerable detail with reference to certain preferred versions thereof, other versions and variations are possible and contemplated. For example, the polarity of the whole circuit can be flipped, so the positive (+) supply rail is used as the common, and all voltages are below (or more negative relative to) that voltage. Alternatively, several or all of the bits may be decoded so that instead of binary weighting, the D/A function is achieved using equally weighted resistors. An illustration of a mixed binary/equal weighted resistor tree is to have all but the 3 most significant bits weighted in a normal binary fashion. In this case, the upper 3 bits are decoded into a "thermometer" code: 000 input gives 1 segment high, 010 puts 2 parallel segments high, 011 puts 3 high, etc. (This is done usually to lessen glitch energy. With straight binary weighting, at the MSB transition, all switches change at once. If the ones going in one direction do not match the ones going in the other, a "glitch" occurs.) In another alternative embodiment, the impedances of the switches are generally scaled to match their "importance" in the resistor ladder (i.e., the MSB switch is the largest, the next-to-MSB is ½ as large, etc.). This latter approach provides an improved use of silicon area verses accuracy. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A digital to analog converter, comprising:
   a first string of N type diffused resistors;
   a second string of P type diffused resistors;
   said first and second strings each divided into segments and coupled together at a plurality of switch nodes and an output node; and
   a plurality of bit switches, each responsive to a corresponding one of a plurality of data bits for switching a corresponding one of said plurality of switch nodes between common and reference voltages.

2. The digital to analog converter of claim 1, wherein each of said N type diffused resistors is formed in a PWell coupled to said common voltage and wherein each of said P type diffused resistors is formed in an NWell coupled to said reference voltage.

3. The digital to analog converter of claim 1, wherein a ratio of values of said P type and N type diffused resistors is adjusted to achieve a net zero voltage coefficient between said first and second strings.

4. The digital to analog converter of claim 1, wherein said first and second strings each comprise an R-2R ladder having a plurality of 2R resistors each coupled to a corresponding switch node.

5. The digital to analog converter of claim 4, wherein each of said plurality of bit switches selectively switches an N type 2R resistor of said first string and a corresponding P type 2R resistor of said second string between said common and reference voltages.

6. The digital to analog converter of claim 1, wherein each bit switch comprises:
   a driver, driven between said common voltage and a source voltage, having an input that receives a corresponding one of said plurality of data bits and an output that switches between said source and common voltages;

an inverter driver, driven between said common voltage and a difference voltage being a voltage difference between said source voltage and said reference voltage, having an input that receives said corresponding data bit and an output that switches between said difference voltage and said common voltage;

a first NMOS device having a drain coupled to said reference voltage, a gate coupled to said output of said driver and a source coupled to a corresponding one of said plurality of switch nodes; and a second NMOS device having a drain coupled to said corresponding switch node, a gate coupled to said output of said inverter driver and a source coupled to said common voltage.

7. The digital to analog converter of claim 6, wherein said first and second NMOS devices each have a floating PWell coupled to its source.

8. The digital to analog converter of claim 6, further comprising a voltage generator providing said difference voltage, said voltage generator comprising:

a first resistor having a first end coupled to said source voltage and a second end developing said difference voltage;

a second resistor having a first end coupled to said common voltage and a second end;

a current source having an input coupled to said source voltage and an output;

a PNP transistor having an emitter coupled to said output of said current source, a base coupled to said reference voltage, and a collector coupled to said common voltage; and an NPN transistor having a collector coupled to said second end of said first resistor, a base coupled to said emitter of said PNP transistor, and an emitter coupled to said second end of said second resistor.

9. A digital to analog converter, comprising:

a first R-2R resistor ladder of N type resistors coupled between a common voltage node and an output voltage node;

a second R-2R resistor ladder of P type resistors coupled between said common and output voltage nodes;

said first and second R-2R resistor ladders having a plurality of common switch terminals, each of said plurality of common switch terminals coupling one end of an N type 2R resistor of said first R-2R resistor ladder to one end of a corresponding P type 2R resistor of said second R-2R resistor ladder; and a plurality of single-pole, double-throw (SPDT) switches, each responsive to a corresponding one of a plurality of data bits for switching a corresponding one of said plurality of common switch terminals between said common voltage node and a reference voltage node.

10. The digital to analog converter of claim 9, wherein each N type resistor is formed in a PWell coupled to said common voltage node and wherein each P type resistor is formed in an NWell coupled to said reference voltage node.

11. The digital to analog converter of claim 9, wherein a ratio of values of said P type and N type resistors is adjusted to achieve a net zero voltage coefficient between said first and second R-2R resistor ladders.

12. The digital to analog converter of claim 9, wherein each SPDT switch comprises:

a driver, powered between said common voltage node and a voltage source, having an input that receives a corresponding data bit and an output that switches between voltage levels of said voltage source and said common voltage node;

an inverter driver, powered between said common voltage node and a difference voltage being a voltage difference between said voltage source and said reference voltage node, having an input that receives said corresponding data bit and an output that switches between voltage levels of said difference voltage and said common voltage node;

a first NMOS device having a drain coupled to said reference voltage node, a gate coupled to said output of said driver and a source coupled to a corresponding one of said plurality of common switch terminals; and a second NMOS device having a drain coupled to said corresponding common terminal, a gate coupled to said output of said inverter driver and a source coupled to said common node.

13. The digital to analog converter of claim 12, wherein said first and second NMOS devices each have a floating PWell coupled to its source.

14. The digital to analog converter of claim 12, further comprising a voltage generator providing said difference voltage, said voltage generator comprising:

a first resistor having a first end coupled to said voltage source and a second end developing said difference voltage;

a second resistor having a first end coupled to said common voltage node and a second end;

a current source having an input coupled to said voltage source and an output;

a PNP transistor having an emitter coupled to said output of said current source, a base coupled to said reference voltage node, and a collector coupled to said common voltage node; and an NPN transistor having a collector coupled to said second end of said first resistor, a base coupled to said emitter of said PNP transistor, and an emitter coupled to said second end of said second resistor.

15. A method of converting a plurality of data bits to an analog value, comprising:

forming a pair of P and N type diffused resistor strings coupled in parallel between a common node and an output node and with a plurality of intermediate nodes; and forming a plurality of switches, each responsive to a corresponding data bit to switch a corresponding intermediate node between the common node and a reference voltage node.

16. The method of claim 15, wherein said forming a pair of P and N type diffused resistor strings comprises forming each N type diffused resistor in a PWell coupled to the common node and forming each P type diffused resistor in an NWell coupled to the reference voltage node.

17. The method of claim 15, further comprising adjusting a ratio of values of the P and N type diffused resistor strings to achieve a net zero voltage coefficient.

18. The method of claim 15, wherein said forming a plurality of switches comprises:

forming a plurality of drivers, each responsive to a corresponding data bit for switching its output between a voltage level of the common node and a source voltage level;

forming a plurality of inverting drivers, each responsive to a corresponding data bit for switching its output between a voltage level of the common node and a difference voltage being a difference between the source voltage level and a voltage of the reference voltage node;

forming a plurality of first NMOS devices, each having a gate coupled to the output of a corresponding one of the plurality of drivers, a drain coupled to the reference voltage node, and a floating PWell and source coupled to a corresponding intermediate node; and forming a plurality of second NMOS devices, each having a gate coupled to the output of a corresponding one of the plurality of inverting drivers, a drain coupled to the corresponding intermediate node, and a floating PWell and source coupled to the common node.

\* \* \* \* \*